(12) United States Patent
Rokugawa et al.

(10) Patent No.: US 6,418,615 B1
(45) Date of Patent: Jul. 16, 2002

(54) METHOD OF MAKING MULTILAYERED SUBSTRATE FOR SEMICONDUCTOR DEVICE

(75) Inventors: Akio Rokugawa; Masayuki Sasaki; Yuichi Matsuda, all of Nagano (JP)

(73) Assignee: Shinko Electronics Industries, Co., Ltd., Nagano (JP)

( * ) Notice: Subject to any disclaimer, the term of this patent is extended or adjusted under 35 U.S.C. 154(b) by 0 days.

(21) Appl. No.: 09/523,149

(22) Filed: Mar. 10, 2000

(30) Foreign Application Priority Data

Mar. 11, 1999 (JP) .......................................... 11-064248
Dec. 27, 1999 (JP) .......................................... 11-370984

(51) Int. Cl.[7] ............................................. H01K 3/10
(52) U.S. Cl. ............................. 29/852; 29/830; 29/832; 29/890
(58) Field of Search ...................... 29/840, 852, 830, 29/829, 825

(56) References Cited

U.S. PATENT DOCUMENTS

| | | | | |
|---|---|---|---|---|
| 5,321,210 A | * | 6/1994 | Kimbara et al. | |
| 5,322,593 A | * | 6/1994 | Hasegawa et al. | 29/830 |
| 5,337,466 A | * | 8/1994 | Ishida | 29/830 |
| 5,426,849 A | * | 6/1995 | Kimbara et al. | 29/830 |
| 5,590,461 A | * | 1/1997 | Ishida | 29/830 |
| 5,628,852 A | * | 5/1997 | Ishida | 29/830 |
| 5,686,702 A | * | 11/1997 | Ishida | |
| 5,745,984 A | * | 5/1998 | Cole, Jr. et al. | |
| 6,049,123 A | * | 4/2000 | Burns | |
| 6,214,641 B1 | * | 4/2001 | Akram | |

FOREIGN PATENT DOCUMENTS

JP 5-259639 10/1993

* cited by examiner

Primary Examiner—Carl J. Arbes
(74) Attorney, Agent, or Firm—Pennie & Edmonds LLP

(57) ABSTRACT

A substrate of multilayered structure having a plurality of sets of an insulation layer and a wiring line layer, and having one face for mounting a semiconductor element thereon and the other face on which external connection terminals are to be provided, the face for mounting a semiconductor element being provided with pads to be bonded to an electrode terminal of the semiconductor element, the other face being provided with pads to be bonded to an external connection terminal, such as a terminal formed of a solder ball, and the wiring line layers on both sides of an insulation layer being connected with each other by vias piercing the insulation layer, wherein the surfaces of the pads to be bonded to an electrode terminal of a semiconductor element are flat and are in the same plane. A method of manufacturing such a multilayered substrate is also disclosed.

21 Claims, 16 Drawing Sheets

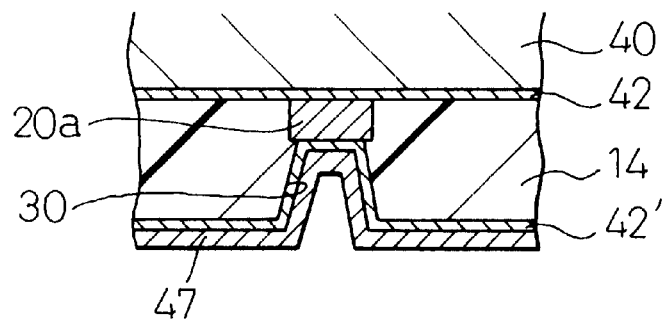
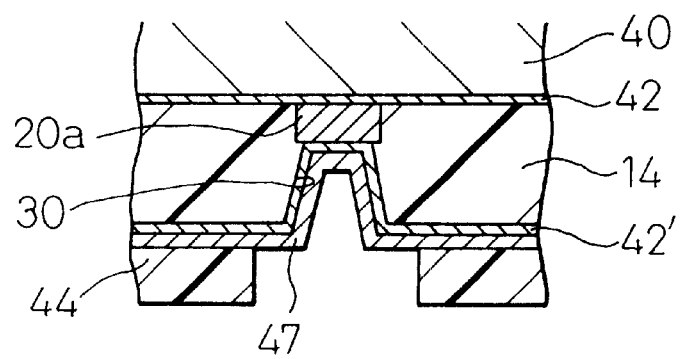
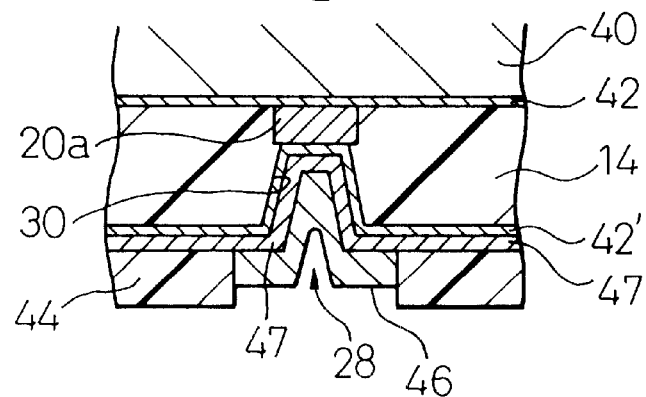

METHOD OF MAKING MULTILAYERED SUBSTRATE FOR SEMICONDUCTOR DEVICE

BACKGROUND OF THE INVENTION

1. Field of the Invention

The invention relates to a multilayered substrate for a semiconductor device. More particularly, the invention relates to a multilayered substrate formed of a plurality of sets of a conductor layer and an insulation layer, i.e., a laminate of alternate conductor and insulation layers, and having a face for mounting semiconductor element thereon and another face for external connection terminals, the face for mounting semiconductor device being provided with pads through which the substrate is connected to a semiconductor element to be mounted thereon, and the face for external connection terminals being provided with pads through which the substrate is connected to an external electrical circuit. The invention also relates to a method of manufacturing such a multilayered substrate.

2. Description of the Related Art

A typical multilayered substrate for semiconductor device, which may be simply called a multilayered substrate herein, is illustrated in FIG. 19. This multilayered substrate 100 has a core substrate 102 made of resin, and an upper layered section 106a and a lower layered section 106b provided on the respective sides of the core substrate 102, each of the upper and lower layered sections 106a and 106b having layered wiring lines 104 of a conductor, and the wiring lines 104 of the upper and lower layered sections 106a and 106b being electrically connected through a through hole via 110 piercing through the core substrate 102. Also in each of the upper and lower layered sections 106a and 106b, wiring lines 104 on both sides of an insulation layer of resin are electrically connected through a via 118 piercing the insulation layer.

In the outermost layer of the upper layered section 106a, pads 124 are provided which are electrically connected with an electrode terminal 122 of a semiconductor element 120 to be mounted on the multilayered substrate 100. The outermost layer of the upper layered section 106a is covered by a solder resist 126 except for the pads 124.

In the outermost layer of the lower layered section 106b, pads 130 are formed to which a solder ball 128, as an external connection terminal, is to be bonded. The outermost layer of the lower layered section 106b is also covered by a solder resist 132 except for the pads 130.

The multilayered substrate for semiconductor element shown in FIG. 19 can be produced by a build-up process illustrated in FIGS. 20A to 20F. According to the build-up process, the upper and lower layered sections 106a and 106b shown in FIG. 19 are simultaneously formed. For this reason, FIGS. 20A to 20F show only the formation of the upper layered section 106a, omitting the formation of the lower layered section 106b.

In the process shown in FIGS. 20A to 20F, a core substrate of resin 102 having a copper foil 100 on each side is first pierced by a means such as a drill to be provided with through holes. A copper film layer is then formed on the inside wall of the through hole by electroless plating and, as required, by subsequent electrolytic plating, to have a desired thickness and form a through hole via 110 (FIG. 20A).

The copper foil 100 of the core substrate 102 is then subjected to a subtractive process to form wiring lines 104 and pads 105, which are formed as part of the wiring line (FIG. 20B). A film 106 of polyimide, which is a thermosetting resin, having one face provided with a copper foil 108 thereon is adhered to the core substrate 102, with the face provided with the copper foil 108 being upwardly faced (FIG. 20C). In the step of adhesion of the polyimide film 106, a resin, such as a polyimide resin, is filled in the through hole vias 110. The film 106 with the copper foil 108 is then pierced by a laser beam to form holes 107 for the formation of vias, the hole extending to the underlying wiring line 104 to expose the pad 105 (FIG. 20D).

A copper layer 112 is then formed on the inside wall of each of the holes 107 to electrically connect the pad 105 of the wiring line 104 and the copper foil 108 (FIG. 20E). The copper layer 112 is formed by covering the copper foil 108 by a resist film 114 to leave the holes 107 uncovered, as shown in FIG. 20E, and forming a copper film layer, having a certain thickness, only on the inside wall of each hole 107 by electroless plating, sputtering or the like and, as required, by subsequent electrolytic plating.

The resist film 114 is then removed, and the copper foil 108 is subjected to a subtractive process to form wiring lines 116 (FIG. 20F). The wiring line 116 thus formed is electrically connected with the underlying wiring line 114 through a via 118 penetrating the resin layer 106.

By repeating the steps illustrated in FIGS. 20C to 20F, the multilayered substrate for a semiconductor, shown in FIG. 19, can be obtained.

Using the multilayered substrate 100 as shown in FIG. 19, a semiconductor element 120 having a high density can be mounted thereon. In the upper layered section 106a of the multilayered substrate 110 of FIG. 19, however, since the respective layers are successively formed upwardly from the surface of the core substrate 102, the outermost layer, on which a semiconductor element 120 is to be mounted, is prone to have a less flat surface (i.e., a less even surface) due to accumulation of unevenness of the underlying layers. Consequently, when a semiconductor element 120 is mounted on the mounting face of the multilayered substrate of FIG. 19 in a flip chip fashion, for example, some of electrode terminals 122 of the semiconductor element 120 may be left unconnected to the pads 124 of the outermost layer of the substrate 100.

In a build-up process illustrated in FIGS. 20A to 20F, the respective layers of the upper and lower layered sections 106a and 106b are simultaneously built up on the respective sides of the substrate, as described above, because if layers are formed only on one side of the substrate, the resultant substrate may be warped. Consequently, even if it is sufficient for a substrate to have only upper layered section, it is required to form the lower layered section to prevent the substrate from being warped, which makes the resultant substrate thicker.

SUMMARY OF THE INVENTION

An object of the invention is to provide a multilayered substrate for semiconductor element having a face for mounting semiconductor element thereon which is as even as possible, and having a thickness as small as possible.

Another object of the invention is to provide a method of manufacturing such a multilayered substrate.

The inventors have found that alternately forming wiring line layers and insulation layers successively from the side for mounting a semiconductor element to the side for external connection terminals makes it possible to produce a multilayered substrate without using a core substrate, the produced multilayered substrate having a face for mounting semiconductor element thereon which is substantially even or is as even as possible.

Thus, in one aspect, the invention provides a substrate of multilayered structure having a plurality of sets of an insulation layer and a wiring line layer, and having one face for mounting a semiconductor element thereon and the other face on which external connection terminals are to be provided, the face for mounting a semiconductor element being provided with pads to be bonded to an electrode terminal of the semiconductor element, the other face being provided with pads to be bonded to an external connection terminal, such as a terminal formed of a solder ball, and the wiring line layers on both sides of an insulation layer being connected with each other by vias piercing the insulation layer, wherein the surfaces of the pads to be bonded to an electrode terminal of a semiconductor element are flat and are in the same plane. In this multilayered substrate of the invention, the surfaces of the pads to be bonded to an external connection terminal may be or may not be flat, and may be or may not be in the same plane.

Preferably, the via is made up of a metallic layer formed along the inside wall and bottom of a hole piercing through the insulation layer.

Preferably, the via is made up of a column of metal filled in a hole piercing through the insulation layer.

More preferably, the column of metal has end faces which are flat and are respectively connected with the wiring lines on both sides of the insulation layer.

Preferably, the pad to be bonded to an electrode terminal of the semiconductor element has a surface layer of metallic material which is melted at a temperature used to bond the pad to the electrode terminal of the semiconductor element.

More preferably, the surface layer is formed of a solder material.

Preferably, the pad to be bonded to an electrode terminal of the semiconductor element is formed of two or more layers of metals, and the layer directly in contact with the electrode terminal of the semiconductor element is based on a noble metal.

More preferably, the noble metal is gold.

The substrate of multilayered structure of the invention may comprise a frame member in a peripheral region of the face for mounting a semiconductor element thereon.

Preferably, the frame member is made of copper, aluminum, or stainless steel.

The substrate of multilayered structure of the invention may also comprise a thin film capacitor incorporated therein.

In another aspect of the invention, the substrate of a multilayered structure of the invention can be manufactured by a method in which a plurality of sets of an insulation layer and a wiring line layer are successively formed from the side of the multilayered substrate at which the face for mounting a semiconductor element is located to the other side of the multilayered substrate at which another face of the multilayered substrate is located, while wiring line layers on both sides of each insulation layer are connected with each other by vias piercing the insulation layer.

Thus, the method of the invention can comprise the following steps:

(a) providing a metal sheet,
(b) forming, on the metal sheet, the pads to be bonded to an electrode terminal of the semiconductor element,
(c) forming a layer of insulating material on the metal sheet so as to cover the pads formed thereon,
(d) piercing the layer of insulating material to form holes which expose the end face of the pad,
(e) forming a patterned metal layer to provide a layer of wiring lines which includes wiring lines formed on the layer of insulating material and vias, the via connecting the pad in the hole with the wiring line on the layer of insulation material,
(f) forming a layer of insulation material to cover the layer of wiring line,
(g) piercing the layer of insulating material formed in step (f) to form holes which expose part of the underlying wiring line,
(h) forming a patterned metal layer to provide a layer of wiring lines which includes wiring lines formed on the layer of insulating material and vias, the via connecting the part of the wiring line exposed in step (g) with the wiring line on the layer of insulation material,
(i) repeating steps (f) to (h) until the predetermined number of sets of an insulation layer and a wiring line layer is obtained, and
(j) removing the metal sheet from the sets of an insulation layer and a wiring line layer formed thereon.

Preferably, the metal sheet is removed by etching.

Preferably, the metal sheet is made of cooper, aluminum, or stainless steel.

Preferably, the metal sheet has a seed layer on a surface on which the sets of an insulation layer and a wiring line layer are to be formed, the seed layer being made up of two or more sublayers of different metal materials, and the sublayer in contact with the metal sheet being formed of a metal material which is not etched or is substantially not etched by an etchant for the metal sheet.

More preferably, the metal sheet is formed of copper, and the seed layer is made up of a sublayer, in contact with the metal sheet, of chromium or titanium, and another sublayer of copper.

A metal sheet provided with a layer of insulating material on a surface may be used, and the pads to be bonded to an electrode terminal of the semiconductor element may be formed by piercing through the layer of insulating material to form holes exposing the surface of the metal sheet, and then electrolytically plating the exposed surface of the metal sheet to form a plated layer in the hole.

Preferably, the metal sheet is partially removed so as to leave a frame member on a peripheral region of the multilayered substrate.

Preferably, the formation of vias in steps (e) and/or (h) is carried out by forming a metal layer along the inside wall and bottom of the hole piercing through the insulation layer.

Preferably, the formation of vias in steps (e) and/or (h) is carried out by making a column of metal material filling the hole piercing through the insulation layer.

Preferably, the column is made by forming a layer of metal to cover the insulation film and fill the holes piercing through the insulation film, and then abrading the formed layer of metal to expose the insulation film and leave the metal filling the hole.

Preferably, the pad to be bonded to an electrode terminal of the semiconductor element is formed so as to have a surface layer of metallic material which is melted at a temperature used to bond the pad to the electrode terminal of the semiconductor element.

More preferably, the surface layer is formed of a solder material.

Preferably, the pad to be bonded to an electrode terminal of the semiconductor element is formed so as to have two or more layers of metals, the layer to be directly in contact with the electrode terminal of the semiconductor element being based on a noble metal.

More preferably, the noble metal is gold.

BRIEF DESCRIPTION OF THE DRAWINGS

The above and other objects and advantages of the invention will be well understood and appreciated by a person with ordinary skill in the art, from consideration of the following detailed description made by referring to the attached drawings, wherein:

FIGS. 7A to 7C illustrate an alternative process for forming vias of the multilayered substrate shown in FIG. 1;

DETAILED DESCRIPTION OF THE INVENTION

Figure 1:
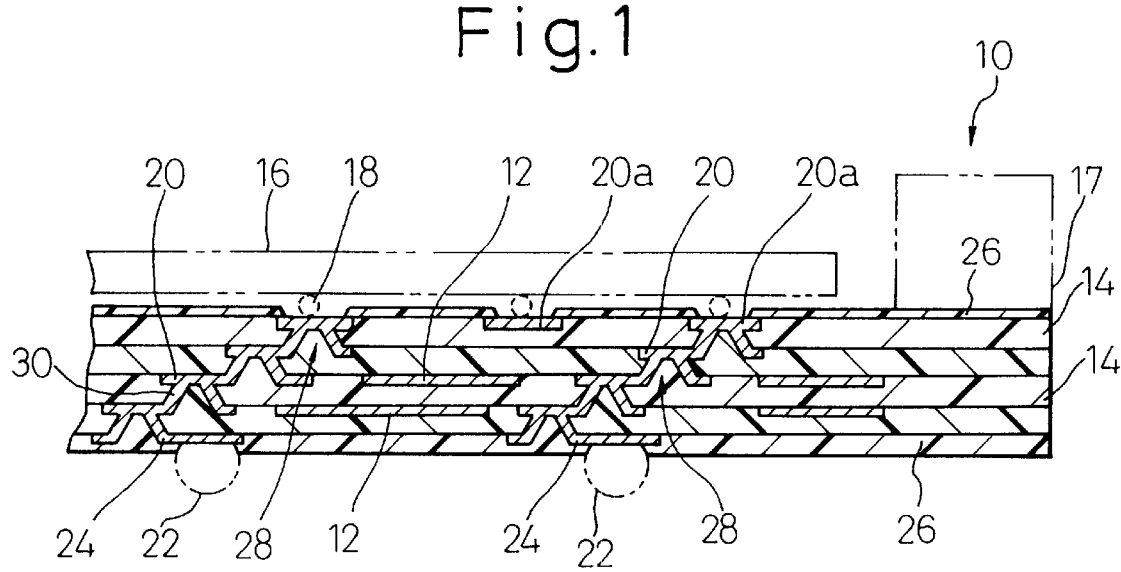
FIG. 1 is a partial sectional view showing an embodiment of the multilayered substrate of the invention.

FIG. 1 illustrates a partial section of an embodiment of the substrate 10 of a multilayered structure of the invention. In this multilayered substrate 10, a plurality of layers of wiring line 12 are present, and are separated from each other by an insulation layer 14 made of a resin, such as a polyimide or polyphenylene ether, interposed therebetween. The multilayered substrate 10 has one face in which pads 20a to be bonded to an electrode terminals 18 of a semiconductor element 16 are provided, and another face on which pads 24 to be bonded to a solder ball 22 as an external connection terminal are provided. Both faces of the multilayered substrate 10 are covered by a layer of solder resist 26 except for the respective pads 20a and 24.

In the multilayered substrate 10 shown in FIG. 1, a pad 20, which is used for the connection of a wiring line in one layer with a wiring line in another layer and can be formed as part of the wiring line of one of the layers, or the pad 20a for the connection with a semiconductor element or the pad 24 for the connection with an external connection terminal, in one of the wiring line layers are electrically connected with another pad 20, 20a, or 24 of the adjacent wiring line layer through a via 28 piercing the insulation layer 14 interposed between the wiring line layers adjacent to each other.

The substrate 10 of multilayered structure shown in FIG. 1 can be manufactured by a method illustrated in FIGS. 2 to 7, in which wiring line layers and insulation layers are alternately formed successively from the side for mounting a semiconductor element thereon to the side to be bonded to external connection terminals, while wiring line layers on both sides of each insulation layer are connected with each other by vias piercing the insulation layer.

Figure 2A:
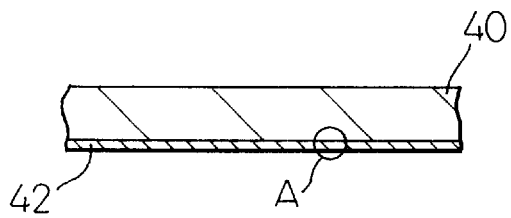
FIGS. 2A to 2F illustrate a method of manufacturing the multilayered substrate shown in FIG. 1.

Specifically, a seed layer 42 is first formed on a surface of a copper sheet 40 as shown in FIG. 2A. It is preferred that the surface of the copper sheet 40 on which the seed layer 42 is to be formed has an average surface roughness (Ra) of 0.1 micrometer or smaller. It is also preferred that if an average surface roughness (Ra) of a surface of a sheet of metal, such as copper as in this example, on which a seed layer is to be formed is in excess of 0.1 micrometer, the surface of the metal sheet is polished to have an average surface roughness (Ra) of 0.1 micrometer or smaller. The copper sheet 40 may be replaced with a sheet of aluminum or stainless steel.

Figure 3:
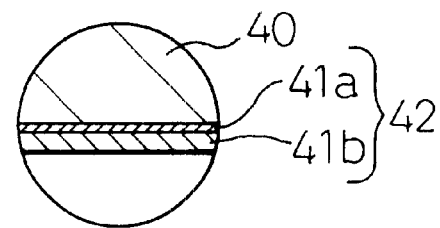
FIG. 3 is a partially enlarged section of the portion, indicated by circle A, of the copper sheet of FIG. 2A, showing the construction of a seed layer provided on its surface.

As shown in FIG. 3, which is a partially enlarged view of the copper sheet 40 provided with the seed layer 42, indicated by circle A, in FIG. 2A, the seed layer 42 formed on the surface of the copper sheet 40 consists of a sublayer of chromium (Cr) 41a directly in contact with the surface of the copper sheet 40 and having a thickness of, for example, 0.01 micrometer, and a sublayer of copper (Cu) 41b formed on the sublayer of chromium 41a and having a thickness of, for example, 0.1 micrometer. The chromium sublayer 41a is not etched by an etchant used later to etch the copper sheet 40 for its removal, as described below, and thus serves as an etching stopper layer during the etching of the copper sheet 40. The copper sublayer 41b serves as an electrical power supply layer during electrolytic plating described below. The chromium and copper sublayers 41a and 41b may be formed by sputtering, evaporation, or electroless plating. In lieu of the sublayer of chromium 41a, a sublayer of metal, which may be etched by an etchant for the copper sheet 40 but has a noticeably slower etching rate than that of the copper sheet 40, may be used.

Figure 2B:
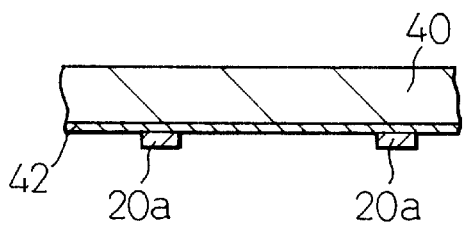

As shown in FIG. 2B, on the seed layer 42 formed on the surface of the copper layer 40, pads 20a of copper are formed which have a thickness of about 10 micrometers, for example, the pad 20a being subsequently bonded to an electrode terminal of a semiconductor element. These pads 20a for the connection with a semiconductor element can be formed by forming a layer of photoresist (not shown) on the seed layer 42, patterning the photoresist layer to expose portions of the seed layer 42 on which the pads 20a are to be formed, and electrolytically plating the exposed portions with copper using the patterned photoresist layer as a mask and using the seed layer 42, particularly the sublayer of copper 41b, as an electrical power supply layer.

Figure 2C:
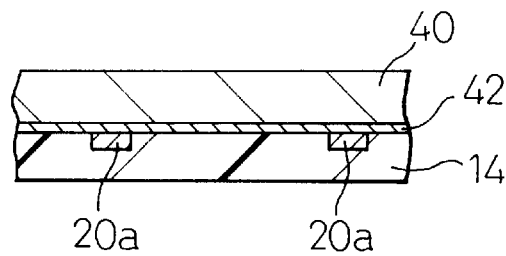
Figure 2D:
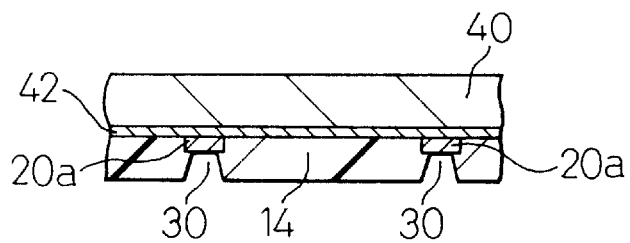

A polyimide, which is a thermosetting resin and has a thickness of about 30 micrometers, for example, is applied so as to cover the pads 20a and the seed layer 42 of the copper sheet 40, by printing or the like, and is cured to form an insulation layer 14, as shown in FIG. 2C. The insulation layer 14 is then pierced by a laser beam, such as YAG laser or carbon dioxide laser beam, to form holes 30 and expose part of the end face of the pads 20a, as shown in FIG. 2D. The hole thus formed has an opening at the surface of the insulation layer 14, and the bottom defined by the exposed surface of the pad 20a, the opening having a larger area than that of the bottom, in general, as exaggeratedly illustrated in the drawing. The holes 30 may be formed by etching the insulation layer 14, or by forming an insulation layer 14 of photosensitive resin and patterning it by a photolithography process.

Figure 2E:
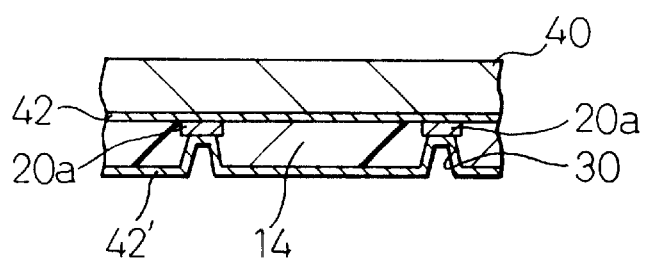

Subsequently, a seed layer 42' is formed to cover the entire surface of the insulation layer 14, including the inside walls of the respective holes 30, and the bottoms of the holes 30 (the exposed surfaces of the respective pads 20a), as shown in FIG. 2E. This seed layer 42' consists also of a sublayer of chromium (not shown for simplicity) in contact directly with the insulation layer 14 and the exposed pads 20a and having a thickness of 0.01 micrometer, for example, and a sublayer of copper (also not shown for simplicity) formed on the sublayer of chromium and having a thickness of 0.1 micrometer, for example.

In lieu of the sublayer of chromium of the seed layer 42', a sublayer of titanium, for example, may be used, which can be formed by sputtering. Also, the seed layer 42' may be formed of thin layer of copper by electroless plating.

Figure 4A:
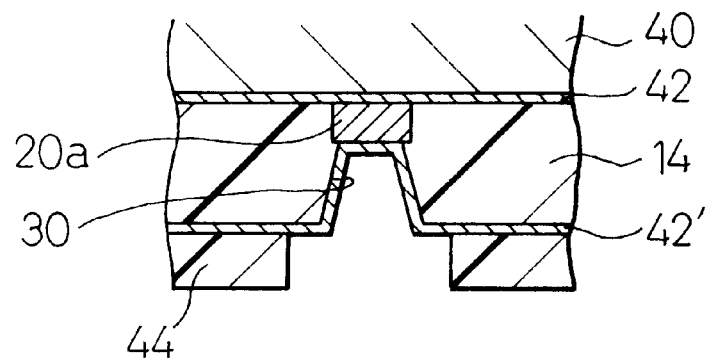
FIGS. 4A and 4B illustrate a process for forming vias of the multilayered substrate shown in FIG. 1.
Figure 4B:
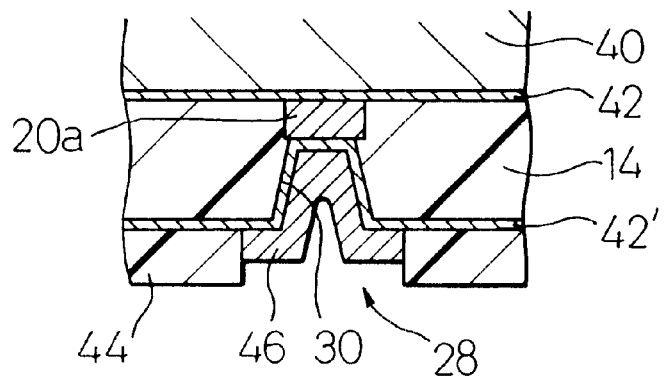

Subsequent to the formation of the seed layer 42', a patterned photoresist layer 44 is formed on the seed layer 42' to expose portions of the seed layer 42' at which wiring lines and vias for the connection of the wiring line with the pad 20a are to be formed, as illustrated in FIG. 4A. A layer of copper 46 is then formed at the exposed portions of the seed layer 42' by electrolytic plating using the seed layer 42' as an electrical power supply layer, to provide vias 28, which consists of the plated copper layer 46 and the underlying seed layer 42', and wiring lines having a thickness of the order of 10 micrometers, as illustrated in FIG. 4B. The via 28 thus formed is a concave via in which the copper layer 46 having a certain thickness is formed along the inside wall of the hole 30.

Figure 2F:
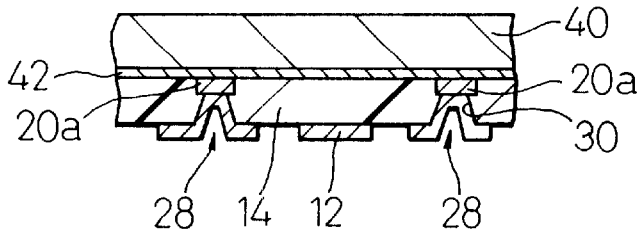

The photoresist layer 44 is then removed, and the exposed seed layer 42' is etched to removal, to leave vias 28 and wiring lines 12 on the surface of the insulation layer 14, as illustrated in FIG. 2F.

Figure 5:
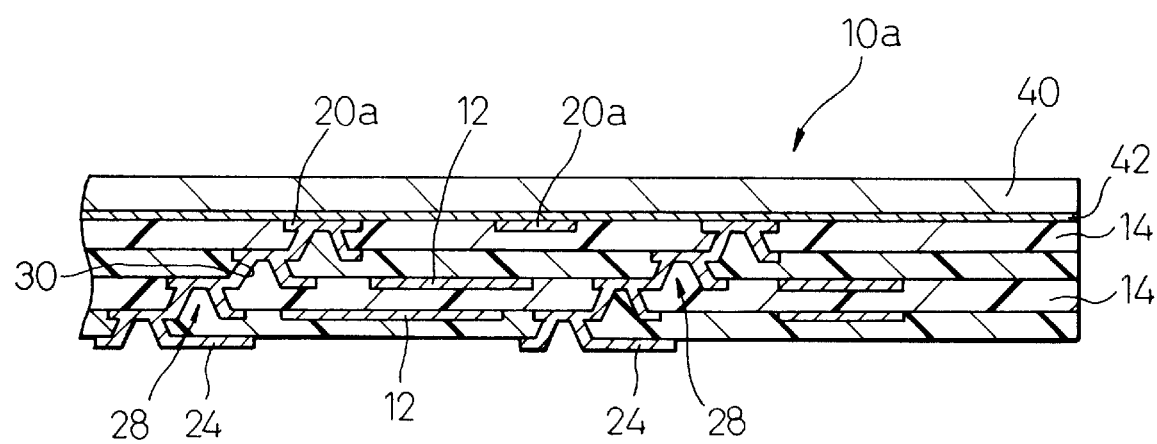
FIG. 5 shows an intermediate product for the multilayered substrate shown in FIG. 1.

By repeating the steps illustrated in FIGS. 2C to 2F and FIGS. 4A and 4B, the required number of sets of insulation and wiring line layers can be formed successively from the side for the mounting of a semiconductor element to the side for external connection terminals, to provide an intermediate product 10a for a multilayered substrate, as shown in FIG. 5. The intermediate product 10a thus obtained has pads 20a for the mounting of a semiconductor element at one side, which are covered by the copper sheet 40 through the interposed seed layer 42, and pads 24 for the connection with an external connection terminal at the other side, which are formed as part of the formed wiring line. The copper sheet 40 can serve as a reinforcing sheet for the intermediate product 10a, to facilitate the handling thereof, such as during transportation.

To obtain the final product of multilayered substrate 10 as shown in FIG. 1, however, it is required to remove the copper sheet 40 from the intermediate product 10a. The removal of the copper sheet 40 is carried out by etching. Since, in general, it is difficult to strictly control the end of etching, the invention uses the sublayer of chromium 41a of the seed layer 42 shown in FIG. 3, which is not etched by an etchant for copper sheet 40, to prevent the pads 20a for the mounting of semiconductor element from being etched by the etchant used to remove the copper sheet 40.

Figure 6A:
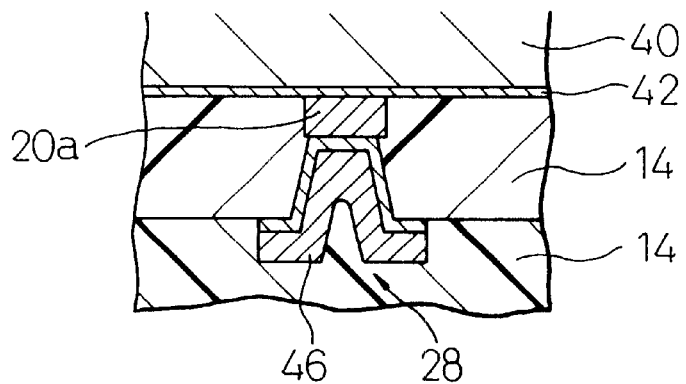
FIGS. 6A to 6C illustrate removal of a copper sheet during the production of the multilayered substrate shown in FIG. 1.
Figure 6B:
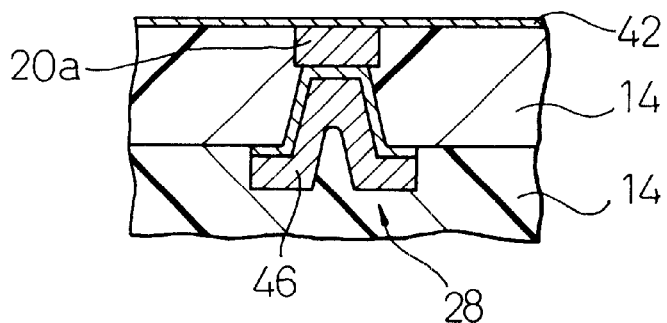
Figure 6C:
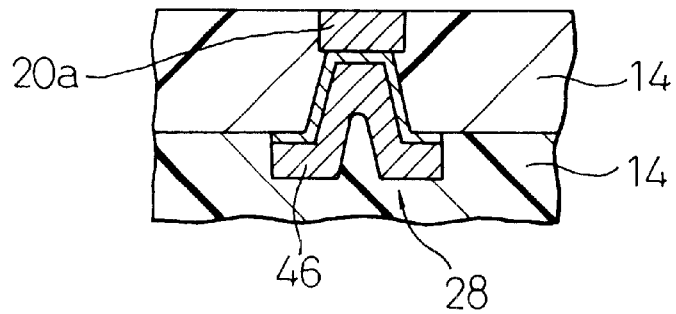

Referring to FIGS. 6A to 6C, the etching of the copper sheet 40 is further described. It is very difficult to etch, at a uniform rate, the entire surface of the copper sheet 40 as shown in FIG. 6A and, accordingly, the etching of copper sheet 40 is prone to provide an uneven etched surface. By the sublayer of chromium 41a (FIG. 3) of the seed layer 42, which is not etched by an etchant for the copper sheet 40, the etching is stopped, even at an area where the etching is locally accelerated, when the etching reaches the sublayer of chromium 41a of the seed layer 42. Consequently, the etchant completely removes the copper sheet 40, without removing or damaging the members of copper material, such as sublayer of copper 41b (FIG. 3) and pads 20a, underlying and protected by the sublayer of chromium 41a (FIG. 3), as illustrated in FIG. 6B.

The seed layer 42 is then removed to expose the surface of the pad 20a for the mounting of a semiconductor element, as shown in FIG. 6C. The removal of the seed layer 42 is carried out by first etching the sublayer of chromium 41a (FIG. 3) using an etchant which etches chromium and does not etch copper, and then etching the sublayer of copper 41b (FIG. 3) using another etchant for copper. When the sublayer of copper 41b (FIG. 3) of the seed layer 42 is etched for its removal, although the pad 20a for the mounting of a semiconductor element is simultaneously etched, the etching raises no problem since the sublayer of copper 41b has a thickness of the order of 0.1 micrometer whereas the pads 20a have a much larger thickness of the order of 10 micrometers.

Subsequently to the removal of the copper sheet 40 and seed layer 42, a patterned solder resist layer is applied to each of the sides provided with the pads 20a for the mounting of a semiconductor element and the side provided with pads 24 for external connection terminals, so as to expose both pads 20a and 24, to thereby provide the multilayered substrate 10 of the invention as illustrated in FIG. 1.

According to the invention, the multilayered substrate 10 can have a very flat surface which is formed of the pads 20a and insulation layer 14 exposed by the successive removal of the copper sheet 40 and seed layer 42, and the pad 20a of the multilayered substrate 10 can be securely bonded to an electrode terminal 18 of a semiconductor element 16 (FIG. 1).

In the process illustrated in FIGS. 4A and 4B, the patterned photoresist layer 44 is formed on the seed layer 42' by a photolithography process to expose portions of the seed layer 42' at which wiring lines (not shown) and vias 28 are to be formed. The smaller the diameter of the via 28 to be formed is, the smaller the diameter of the hole 30 is, and, accordingly, it is difficult to ensure that the bottom of the hole 30 is irradiated with a sufficient amount of light during exposure of the photolithography process. Consequently, the photoresist filled in the hole 30 prior to the patterning, particularly the photoresist near the bottom of the hole 30, may not be sufficiently photo-reacted during the exposure, and may not be completely removed.

This problem can be avoided by electrolytically plating the seed layer 42' with a copper layer 47 using the seed layer 42' as an electric power supply layer to thereby make the hole 30 shallower, as shown in FIG. 7A, so that the bottom of the hole 30 can receive a sufficient amount of light during exposure, and then forming a photoresist film to cover the copper layer 47 and fill the hole 30. The photoresist film is then patterned to provide a patterned photoresist layer 44, as shown in FIG. 7B, to expose portions of the copper layer 47 at which vias and wiring lines are to be formed. During this patterning, the photoresist filled in the hole 30 having a smaller depth is sufficiently photo-reacted, and can subsequently be completely removed.

As shown in FIG. 7C, by electrolytic plating using the seed layer 42' and the copper layer 47 as electric power supply layers, a patterned copper layer 46 having a certain thickness is formed to provide wiring lines (not shown) and concave vias 28 having a smaller depth. The photoresist layer 44 is then removed, and the exposed copper layer 47 and the underlying seed layer 42' are also removed, to leave vias 28, which consist of the seed layer 42' and the patterned copper layers 47 and 46, and wiring lines 12 on the surface of the insulation layer 14, as illustrated in FIG. 2F.

Figure 8A:
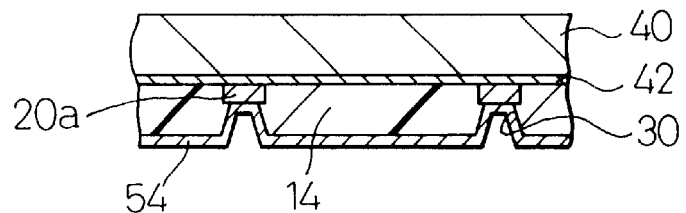
FIGS. 8A to 8C illustrate a further method for forming vias of the multilayered substrate shown in FIG. 1.
Figure 8B:
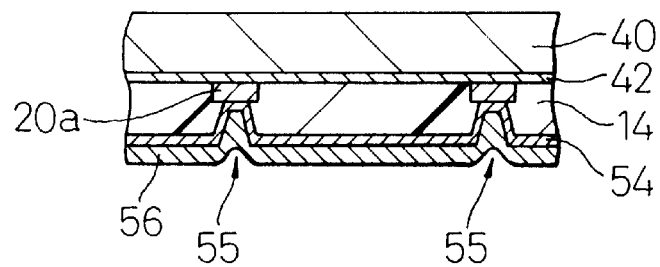
Figure 8C:
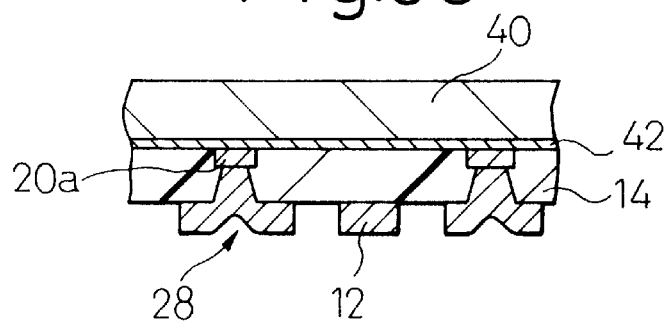

In the case where vias having a still smaller diameter are to be formed, they may be formed by the following method, which is described by making reference to FIGS. 8A to 8C. First, a thin film layer of copper 54 is formed to cover the insulation layer 14 and the exposed surfaces of the pads 20a, as shown in FIG. 8A. The thin film layer of copper 54 may be formed by sputtering, electroless plating or the like. Prior to the formation of the thin film layer of copper 54, a layer of chromium or titanium (not shown) may be formed on the insulation layer 14 by sputtering or electroless plating, the layer of chromium or titanium representing the sublayer 41a of the seed layer 42 referred to above. Using the thin film layer of copper 54 as an electric power supply layer for electrolytic plating, a copper layer 56 is then formed on the thin film layer of copper 54 to have a thickness which enables the holes 30 to be completely filled with the copper material, as illustrated in FIG. 8B. Although the copper layer 56 thus formed has small recesses 55 at locations corresponding to the locations of the respective holes 30, the smaller the diameter of the via to be formed is, the smaller the diameter of the hole 30 is, and also the smaller the recess 55 appearing at the surface of the copper layer 56 is, resulting in the formation of copper layer 56 having an almost flat, or even substantially flat, surface. Subsequently, the copper layers 56 and 54 are patterned to provide vias 28 and wiring lines 12, as illustrated in FIG. 8C.

Figure 9:
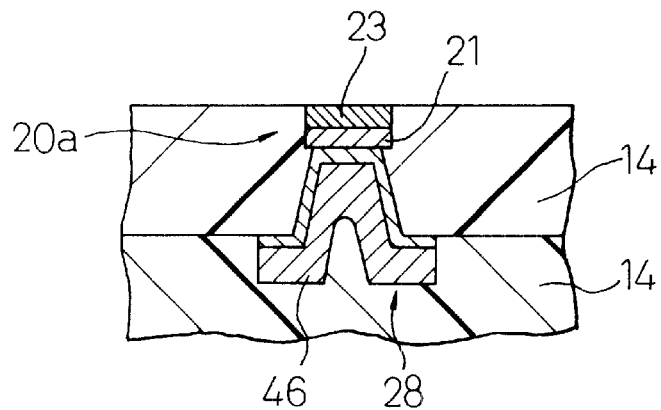
FIG. 9 shows a variant of the pad for mounting a semiconductor element thereon.

In the embodiments illustrated in FIGS. 1 to 8, although the pads 20a for the mounting of a semiconductor element are made up only of a layer of copper, they may be made up of two or more layers of different metals. FIG. 9 shows an example in which the pads 20a for the mounting of a semiconductor element is made up of a layer of copper 21 and a layer of gold 23. The layer of gold 23 forms a surface layer of the pad 20a for the mounting of a semiconductor element, and serves as an surface protective layer for protecting the copper layer 21 from oxidation and the like. In addition, the surface gold layer may also be combined with an underlying nickel layer or underlying palladium and nickel layers to form a laminated structure of gold (Au)-nickel (Ni) or gold (Au)-palladium (Pd)-nickel (Ni).

Figure 10A:
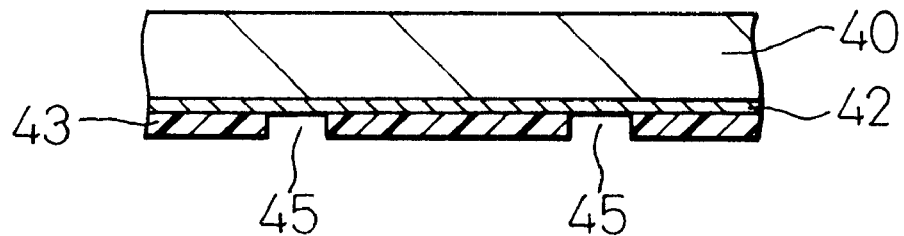
FIGS. 10A to 10C illustrate the formation of the pad shown in FIG. 9.
Figure 10B:
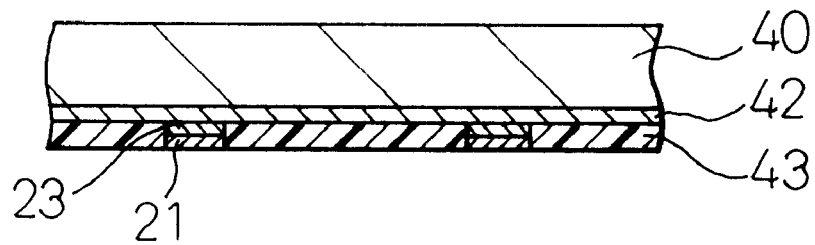
Figure 10C:
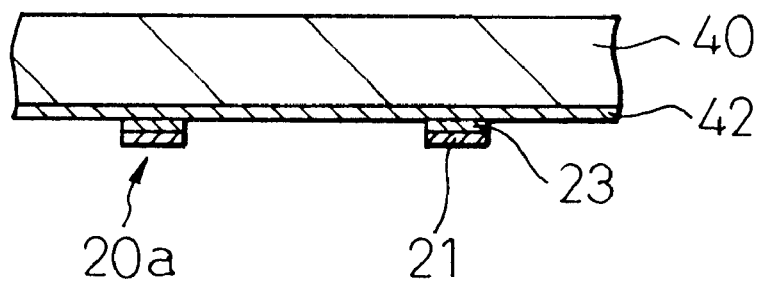

The pads 20a for the mounting of a semiconductor element shown in FIG. 9 may be formed as illustrated in FIGS. 10A to 10C. A resin layer 43 is first formed on a seed layer 42 provided on a copper sheet 40, the seed layer 42 consisting also of sublayers 41a and 41b as illustrated in FIG. 3, and holes 45 for the formation of pads 20a is then formed in the resin layer 43 by use of a laser beam or etching, as shown in FIG. 10A. A layer of gold 23 is formed on the seed layer 42 by electrolytic plating using the seed layer 42 as an electric power supply layer, and a copper layer 21 is then formed on the gold layer 23 by also electrolytic plating, as illustrated in FIG. 10B. Subsequently, the resin layer 43 is removed to provide pads 20a of two-layer structure for the mounting of a semiconductor element, as illustrated in FIG. 10C.

In this embodiment, subsequently to the formation of the pads 20a of two-layer structure, a multilayered substrate can be obtained using any process referred to above.

The gold layer 23 of the pad 20a for the mounting of a semiconductor element shown in FIG. 9 may be substituted with a layer of solder 25. The solder used in the layer 25 is a metallic material having a low melting temperature which is melted under a heating atmosphere of a subsequent step of reflowing another solder material, such as a solder ball, used for mounting a semiconductor element on the multilayered substrate, the melted solder material being capable of electrically connecting the pads 20a with an electrode terminal of a semiconductor element to be mounted. As a solder material forming the solder layer 25, any material which is melted under an heating atmosphere of the reflowing step can be used, with an alloy free of lead, such as a tin (Sn)-silver (Ag) alloy, being preferred.

Figure 11A:
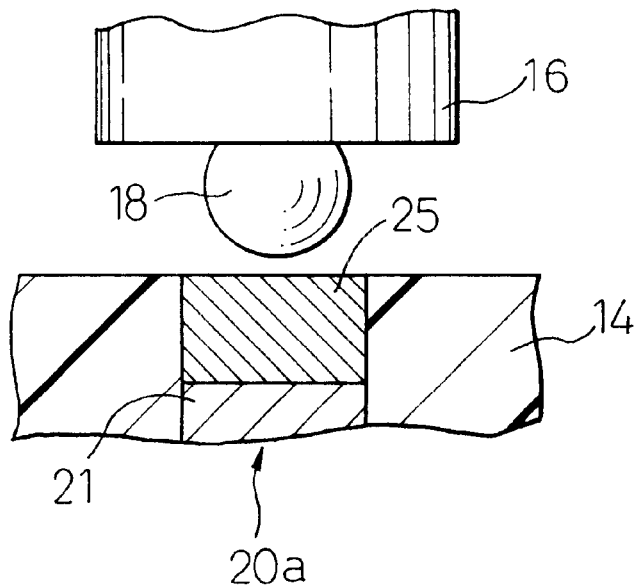
FIGS. 11A and 11B illustrate disconnection of an electrode terminal of a semiconductor element from an pad of a mounting substrate, and connection of an electrode terminal of a semiconductor element with a pad of a mounting substrate through a surface layer of solder of the pad, respectively.
Figure 11B:
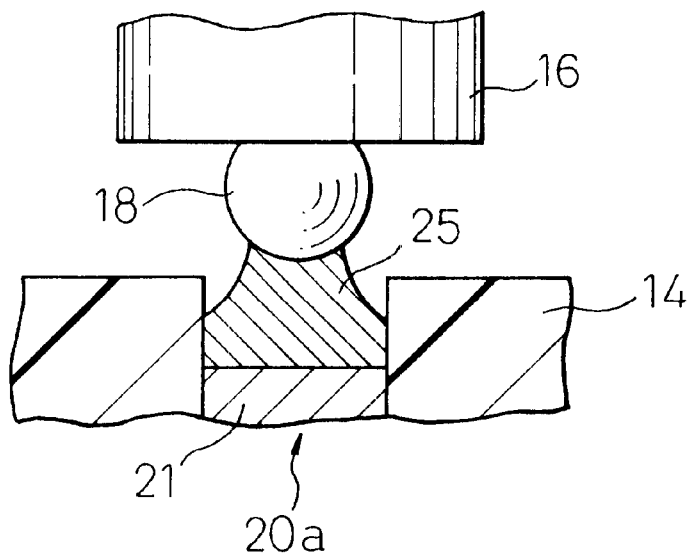

In a process such as flip chip bonding, some of electrode terminals 18 of a semiconductor element 16 may be disconnected from a pad 20a of a multilayered substrate on which the semiconductor element 16 is mounted, as illustrated in FIG. 11A. In the case where a solder layer 25 is provided at the surface of a pad 20a, as described above, such a problem of disconnection of a pad 20a and an electrode terminal 18 of a semiconductor element 16 may be avoided, because the solder layer 25 is melted into a molten solder having an elliptic section due to its surface tension under a heating atmosphere of a reflow process, and part of the molten solder of elliptic section projects over the surface of the insulation layer 14 to be in contact with the electrode terminal 18 of the semiconductor element 16, to thereby electrically connect the pad 20a of the multilayered substrate with the electrode terminal 18 of the semiconductor element 16, as illustrated in FIG. 11B. For the solder layer 25 to be transformed into a molten solder having an elliptic section useful to reliably connect the pad 20a with the electrode terminal 18 of the semiconductor element 16, it is preferred that a solder material for the surface layer 25 of the pad 20a has a lower melting point, for example, 270 to 280° C., than that of a solder material for the electrode terminal 18 of the semiconductor element 16, which has, in general, a melting point of the order of 320° C. Thus, the connection of the pads 20a of the multilayered substrate with the electrode terminals 18 of the semiconductor element 16 mounted on the substrate by the use of the solder layer 25 can enhance reliability of the mounted semiconductor element 16.

The solder layer provided at the surface of the pad 20a can be formed similarly to the formation of the gold layer 23 illustrated in FIG. 10.

In the embodiments described above, the seed layer 42 is formed on one side of the copper sheet 40. When the pad 20a for the mounting of a semiconductor element has a surface layer of gold 23, as shown in FIG. 9, the layer of gold 23 is not etched by an etchant for the copper sheet 40 during its removal and, consequently, the formation of the seed layer 42 (FIG. 2A and FIG. 3) is unnecessary.

On the other hand, when the pad 20a for the mounting of a semiconductor element has a surface layer of solder, the solder layer is etched by an etchant for the copper sheet 40 during its removal. However, in this case, the solder material has a noticeably slower etching rate than that of the copper sheet, and is substantially not etched, and, consequently, the formation of the seed layer 42 (FIG. 2A and FIG. 3) is also unnecessary.

In addition, even when the pad 20a for the mounting of a semiconductor element is formed exclusively of copper, a multilayered substrate can be produced omitting the seed layer 42 (FIG. 2A and FIG. 3) in order to shorten a production process of the multilayered substrate.

A method of producing a multilayered substrate of the invention without using the seed layer 42 on the copper sheet 40 will be described, making reference to FIGS. 12A to 12G. The following description is directed to the manufacture of a multilayered substrate having pads 20a formed of gold and copper layers 23 and 21, although the method described below may also be applied to the manufacture of a multilayered substrate having pads 20a having a surface of solder or copper.

Figure 12A:
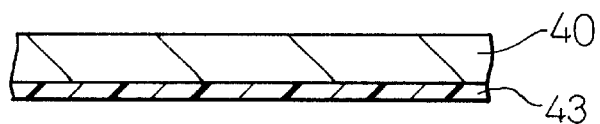
FIGS. 12A to 12G illustrate another method of manufacturing the multilayered substrate shown in FIG. 1.

As shown in FIG. 12A, a resin film 43 is first formed on a surface of a copper sheet 40. It is preferred that a surface on which the resin film 43 is formed has an average surface roughness (Ra) of 0.1 micrometer or smaller, as in the embodiment illustrated in FIG. 2. If an average roughness (Ra) of the surface of the copper sheet 40, on which the resin film 43 is formed, is in excess of 0.1 micrometer, it is preferred that the surface is polished to have an average surface roughness (Ra) of 0.1 micrometer or smaller. The resin film 43 is formed of a resin which is not etched by an etchant for the copper sheet 40, or a resin which is substantially not etched by the etchant, such as an epoxy, polyimide, polyphenylene ether or the like.

Figure 12B:
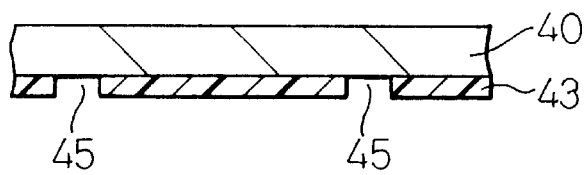
Figure 12C:
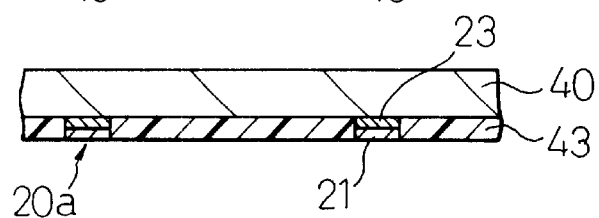

Holes 45 for the formation of pads for the mounting of a semiconductor element are then formed in the resin film 43 by use of a laser beam or etching, as shown in FIG. 12B. Subsequently, a layer of gold 23 is formed in the hole 45 so as to be in contact with the copper sheet 40 by electrolytic plating using the copper sheet 40 as an electric power supply layer, and a copper layer 21 is successively formed on the gold layer 23 by electrolytic plating, to form a pad 20a of two-layer structure for the mounting of a semiconductor element, as illustrated in FIG. 12C.

Figure 12D:
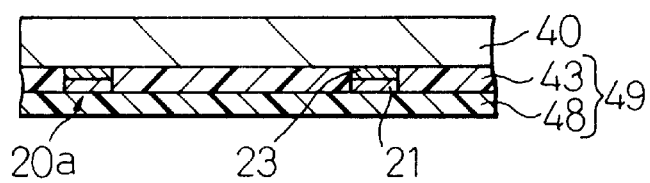

A resin film 48 is then formed so as to cover the pads 20a, as shown in FIG. 12D. The resin film 48 is formed of the same resin as the resin forming the film 43 on the copper sheet 40, and the resin films 43 and 48 are integrated into an insulation layer 49, as illustrated in the drawing.

Figure 12E:
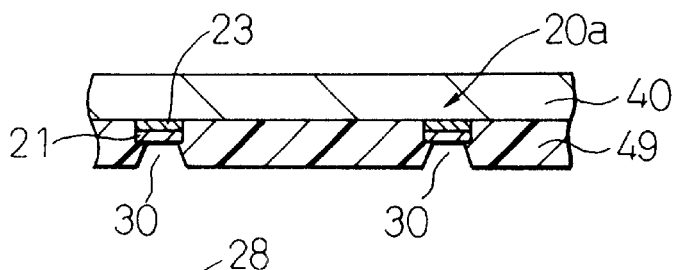

Holes 30 are then formed in the insulation layer 49 by a beam of a laser, such as YAG or carbon dioxide laser, as shown in FIG. 12E. The hole thus formed has an opening at the surface of the insulation layer 49, and the bottom defined by the exposed surface of the pad 20a, the opening having a larger area or diameter than that of the bottom, in general, as exaggeratedly illustrated in FIG. 12E. The hole 30 may be formed by etching the insulation layer 49, or by forming an insulation layer 49 of photosensitive resin and patterning it by a photolithography process.

Figure 12F:
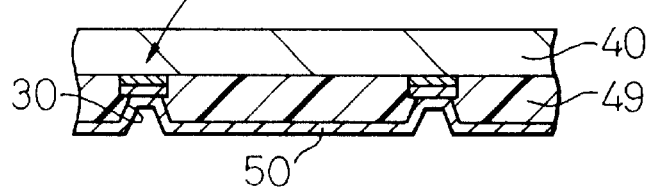

Subsequently, a thin film layer of copper 50 is formed to cover the entire surface of the insulation layer 49, including the inside walls of the holes 30, and the exposed surfaces of the pads 20a, as shown in FIG. 12F, by electroless plating, sputtering, evaporation or the like. The thin film layer of copper 50 on the inside wall of the hole 30 has a thickness of about 0.1 micrometer, for example.

A photoresist layer (not shown) is then formed on the thin film layer of copper 50, and is patterned to expose portions of the copper layer 50 at which vias and wiring lines are to be formed. This step of the formation and patterning of photoresist layer is similar to that already described making reference to FIG. 4A.

A layer of copper (not shown) is then formed at the exposed portions of the thin film layer of copper 50 by electrolytic plating, using the thin film layer of copper 50 as an electrical power supply layer, to provide vias 28 (FIG. 12G) and wiring lines 12 (FIG. 12G) having a thickness of the order of 10 micrometers. The via 28 thus formed is a concave via in which the copper layer having a certain thickness is formed along the inside wall of the hole 30.

Figure 12G:
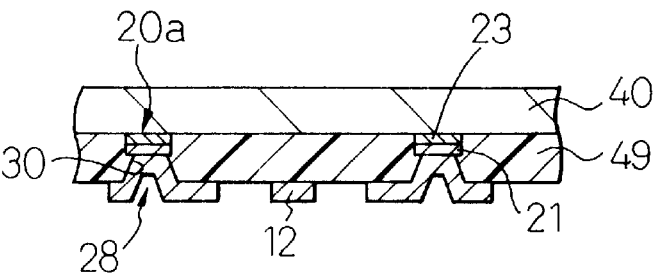

The photoresist layer is then removed, and the exposed thin film layer of copper 50 is etched to removal, to leave vias 28 and wiring lines 12 on the surface of the insulation layer 49, as illustrated in FIG. 12G.

Subsequently, further steps for the production of a multilayered substrate of the invention can be carried out, as in the embodiments of the invention described above, for the completion of a product multilayered substrate.

In the embodiments of the multilayered substrate of the invention described hereinbefore, the via 28 in each of layers of the multilayered substrate is generally a concave via in which a metallic layer having a certain thickness is formed along the inside wall of a hole for the formation of the via, and a further layer is formed on the layer having an uneven configuration resulting from the concave vias therein. Accordingly, a finally produced multilayered substrate tends to have a surface, for external connection terminals, which is more or less uneven. Such unevenness in the surface of multilayered substrate to be provided with external connection terminals may be absorbed when external connection terminals are bonded to the substrate, because solder balls as the external connection terminals are larger than electrode terminals of a semiconductor element to be mounted on the multilayered substrate. With a solder ball having a smaller size, however, pads for external connection terminals of the multilayered substrate is required to be arranged in the same or substantially the same plane.

Figure 13:
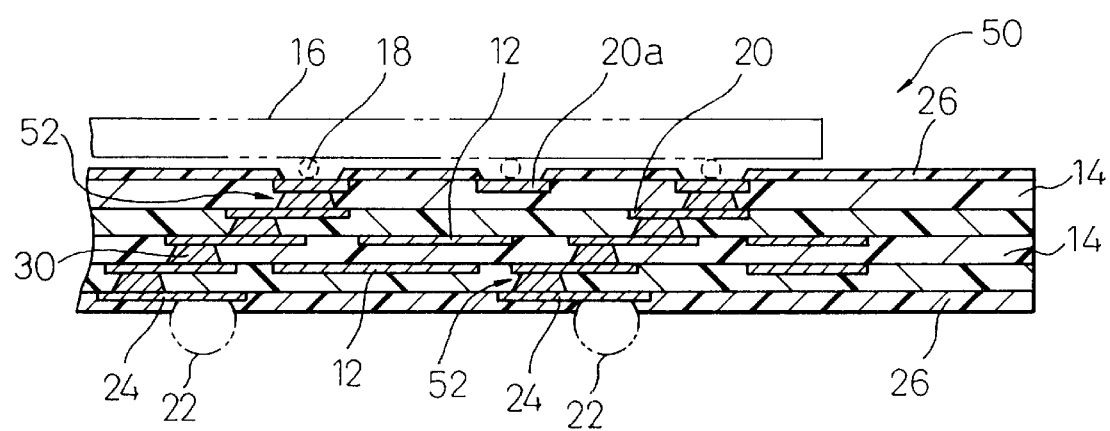
FIG. 13 shows a partial sectional view showing another embodiment of the multilayered substrate of the invention.

FIG. 13 shows a multilayered substrate 50 having pads for external connection terminals which are in the same or substantially the same plane to satisfy such a requirement. In FIG. 13, members of the multilayered substrate 50, which are the same as those of the multilayered substrate 10 illustrated in FIG. 1, are indicated by the same reference numerals as in FIG. 1, and are not described hereinafter in detail.

The multilayered substrate 50 shown in FIG. 13 is different from the multilayered substrate 10 shown in FIG. 1 in that, in the former, vias 52 are columns of copper, i.e., solid bodies formed of copper material filled in holes 30 of an insulation layer 14, and the end faces of the vias 52 formed in an insulation layer 14 are arranged in the same plane.

The multilayered substrate 50 shown in FIG. 13 may be produced by a method illustrated in FIGS. 14A to 14D. In this method, the steps illustrated in FIGS. 2A to 2D are also employed to form holes 30 for the formation of via in the insulation layer 14. The hole 30 has an opening at the surface of the insulation layer 14, and the bottom defined by the exposed surface of the pad 20*a*, the opening having a larger area than that of the bottom, in general, as exaggeratedly illustrated in FIG. 2D.

Figure 14A:
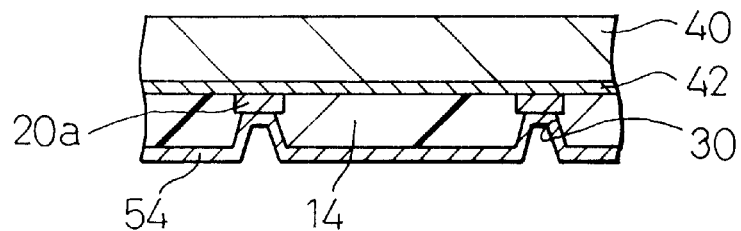
FIGS. 14A to 14D illustrate a method of manufacturing the multilayered substrate shown in FIG. 13.
Figure 14B:
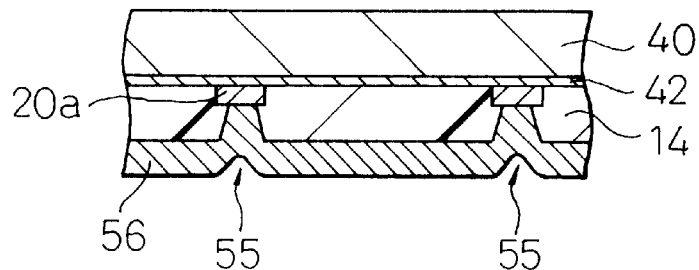

A thin film layer of copper 54 is formed on the surface of the insulation layer 14, including the inside walls of the holes 30, and the exposed surfaces of the pads 20*a* (the bottoms of the holes 30), by sputtering or the like, as shown in FIG. 14A. A further layer of copper (not shown) is then formed on the thin film layer of copper 54 by electrolytic plating using the thin film layer of copper 54 as an electric power supply layer, the plated layer of copper having a thickness enabling the hole 30 to be filled with the copper material, and is integrated with the thin film layer of copper 54 into an integrated copper layer 56, as shown in FIG. 14B. The integrated copper layer 56 thus formed has recesses 55 at the locations corresponding to the locations of the holes 30.

Figure 14C:
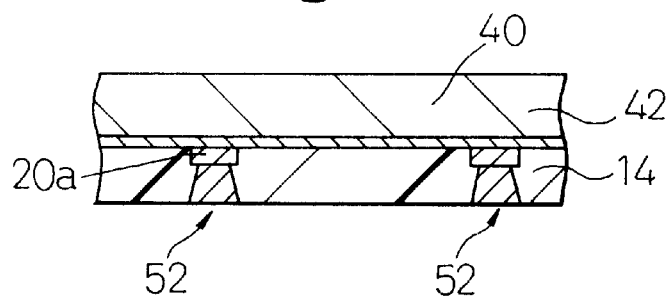

The copper layer 56 on the insulation layer 14 is then abraded to be removed and leave vias 52, which are made up of the copper material filled in the holes 30. At the end of the abrasion, the surface of the insulation layer 14 and the end faces of the vias 52 are positioned in the same plane, as illustrated in FIG. 14C.

Figure 14D:
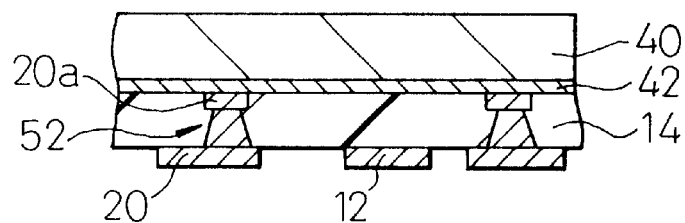

A copper layer (not shown) is then formed to cover the insulation layer 14 and the end faces of the vias 52 by electroless plating, electrolytic plating, sputtering or the like, and is patterned by a photolithography process or the like to form a wiring line layer including pads 20 and wiring lines 12, as shown in FIG. 14D.

Figure 15:
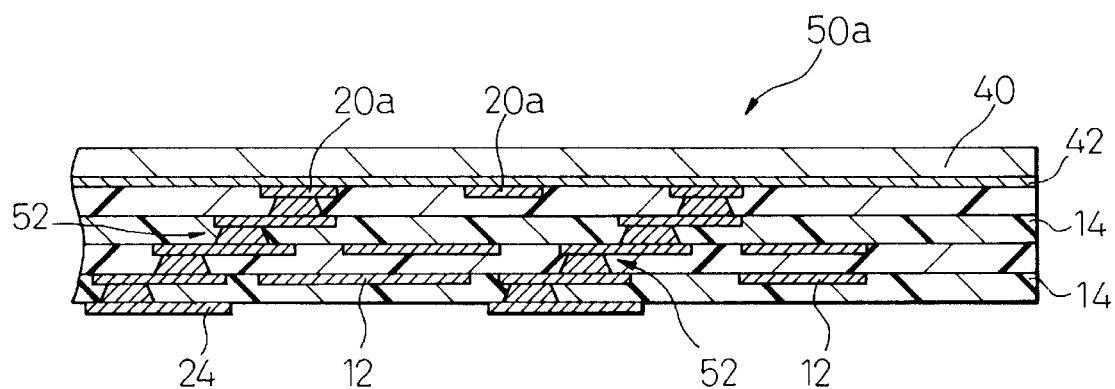
FIG. 15 shows an intermediate product for the multilayered substrate shown in FIG. 13.

Subsequently, by repeating the steps of the formation of an insulation layer and a wiring line layer, a further set or sets of insulation and wiring line layers can be successively formed, to provide an intermediate product 50*a* shown in FIG. 15.

The intermediate product 50*a* thus obtained has the copper sheet 40 bonded to its surface, on which a semiconductor element is to be mounted, through a seed layer 42, as in the intermediate product 10*a* shown in FIG. 5. The copper sheet 40 can serve as a reinforcing sheet for the intermediate product 50*a*, and facilitate handling, such as during transportation, of the intermediate product 50*a*.

To remove the copper sheet 40 from the intermediate product 50*a* to obtain a product multilayered substrate, etching of the copper sheet 40 is carried out by use of an etchant for copper material and, when the etching reaches the sublayer of chromium 41*a* (FIG. 3) forming the seed layer 42, the etching is terminated. Subsequently, the sublayer of chromium 41*a* is removed using an etchant which etches chromium and does not etch copper, and the sublayer of copper 41*b* (FIG. 3) also forming the seed layer 42 is then removed by an etchant for copper.

After the removal of the copper sheet 40 and the seed layer 42 from the intermediate product 50*a*, a patterned solder resist layer 26 is formed on each of the sides of the remaining laminate of sets of the insulation layers 14 and the wiring line layers so as to expose pads 20*a* for the mounting of a semiconductor element and the pads 24 for external connection terminals, to provide the multilayered substrate 50 shown in FIG. 13, which has pads 24 for external connection terminals arranged in the same plane, and is particularly suitable for external connection terminals made up of smaller solder balls.

Figure 16:
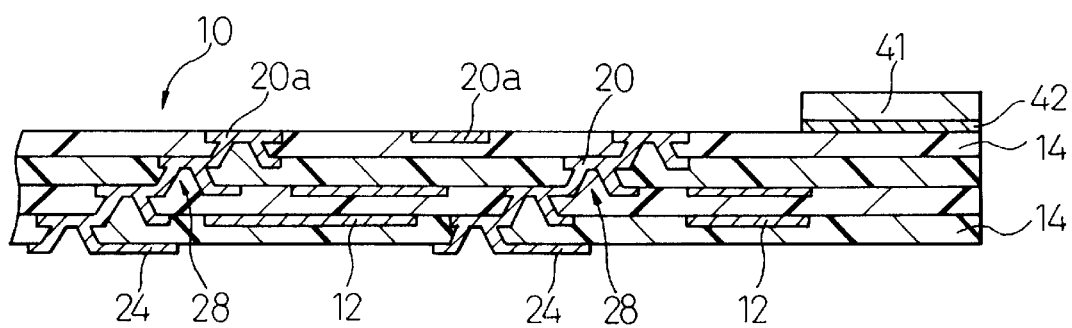
FIG. 16 is a partial sectional view showing a further embodiment of the multilayered substrate of the invention.

Although the copper sheet 40 used in the production of the multilayered substrates 10 and 50 described above is completely removed after finishing the production, part of the copper sheet 40 may be left along a peripheral region of the product multilayered substrate 10 (or 50) to form a frame member 41, as shown in FIG. 16. To leave part of the copper sheet 40 as the frame member 41, a technique such as photolithography may be employed. It should be noted that although FIG. 16 shows only the frame member on the multilayered substrate 10 having concave vias 28, a person with ordinary skill in the art can easily understand that a similar frame member can be provided on the multilayered substrate 50 having solid vias. The frame member 41 is securely bonded to the multilayered substrate 10 (or 50) through the seed layer 42, and can serve as a stiffener for the multilayered substrate 10 (or 50) to improve its handleability during transportation and the like.

Figure 17:
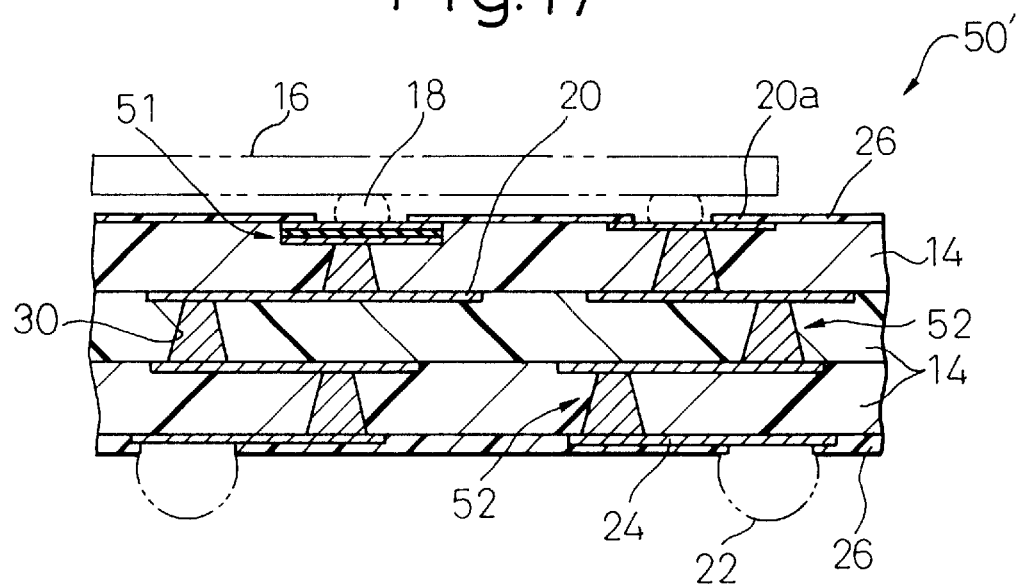
FIG. 17 is a partial sectional view showing a multilayered substrate of the invention having incorporated therein a thin film capacitor.

In addition, it is possible to form a thin film capacitor by interposing a film of dielectric having a high dielectric constant (not shown) between the frame member 41 and the seed layer 42. It is also possible to incorporate a thin film capacitor 51 in a multilayered substrate 50' as illustrated in FIG. 17. In this case, the multilayered substrate 50' represents the multilayered substrate 50 having the solid vias 52 as described making reference to FIG. 13. In the embodiment illustrated in FIG. 17, the thin film capacitor 51 is formed immediately adjacent to an electrode terminal 18 of a semiconductor element 16 to be mounted on the substrate 50'.

Figure 18A:
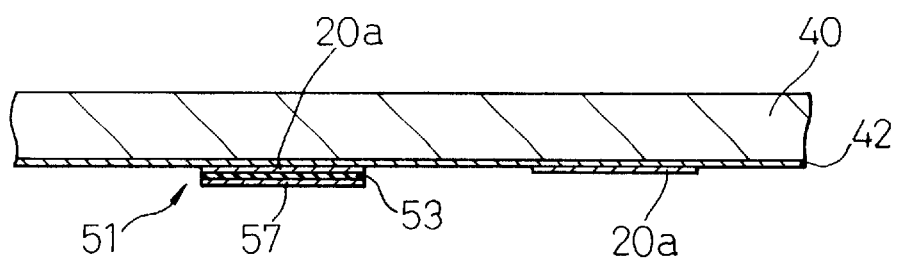
FIGS. 18A and 18B illustrate a process for forming the thin film capacitor in the multilayered substrate shown in FIG. 17.
Figure 18B:
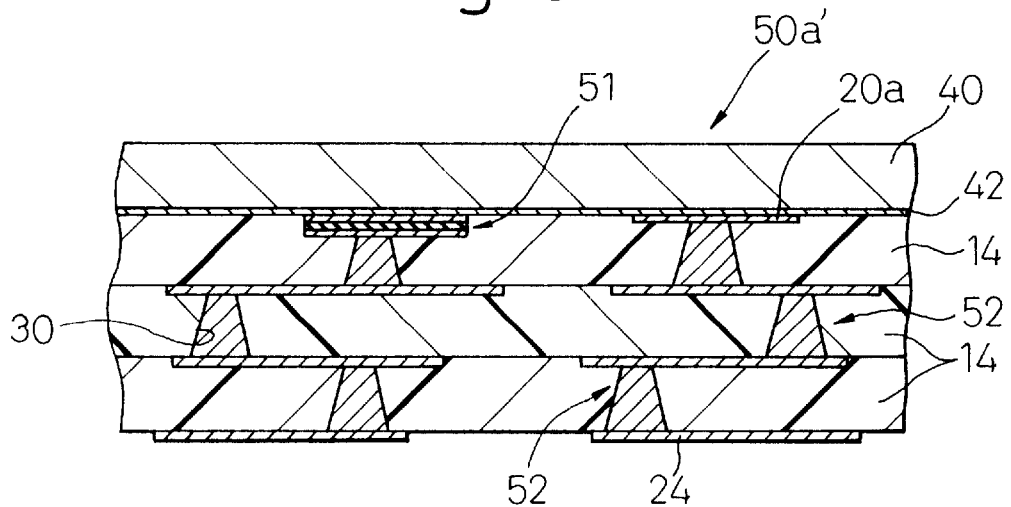
Figure 19:
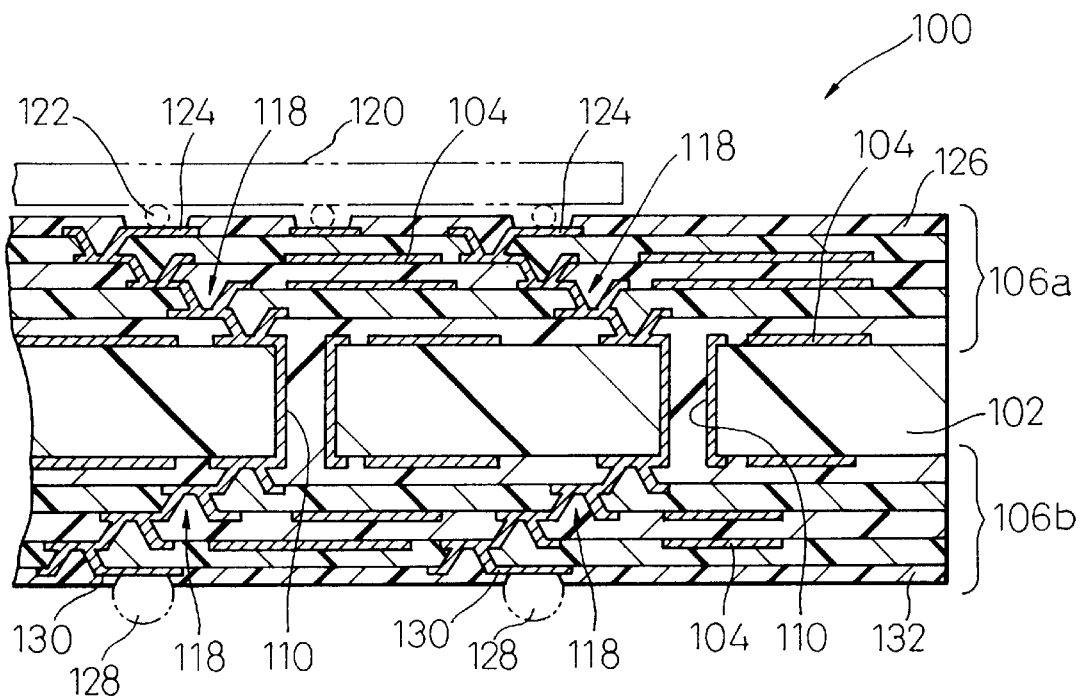
FIG. 19 is a partial sectional view showing a conventional multilayered substrate.
Figure 20A:
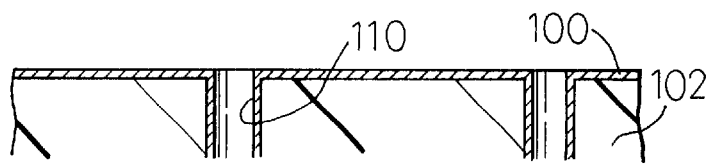
FIGS. 20A to 20F illustrate a method of manufacturing the multilayered substrate shown in FIG. 19.
Figure 20B:
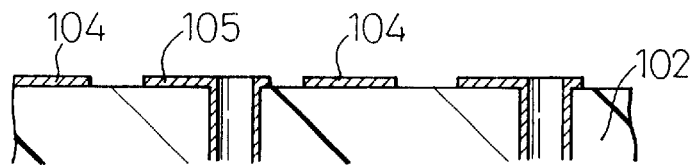
Figure 20C:
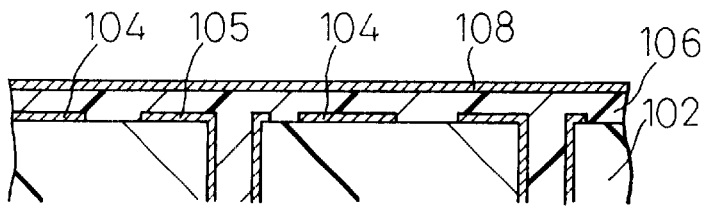
Figure 20D:
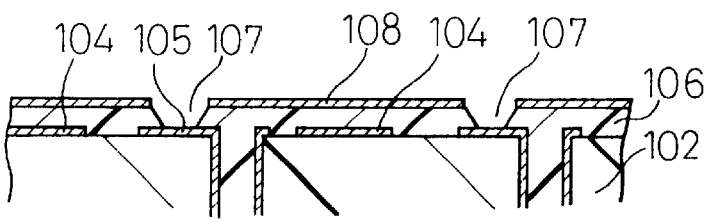
Figure 20E:
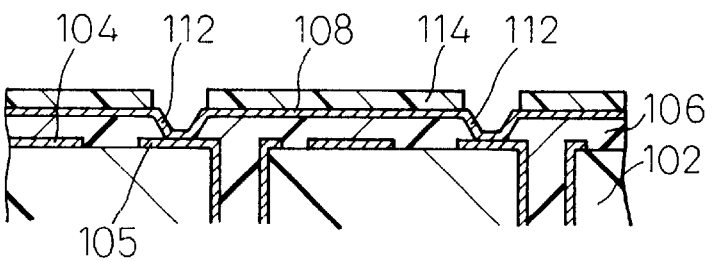
Figure 20F:
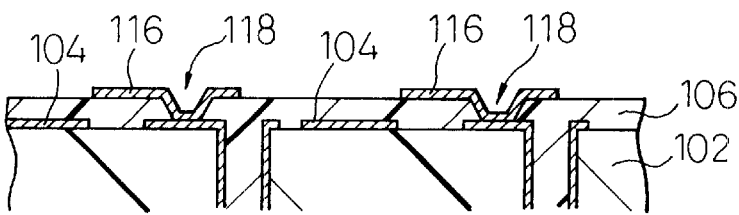

The thin film capacitor 51 incorporated in the multilayered substrate 50' shown in FIG. 17 is formed on the seed layer 42 provided on the surface of the copper sheet 40, as illustrated in FIG. 18A. Specifically, a pad 20*a* for the mounting of a semiconductor element is first formed on the seed layer 42 by sputtering. A layer of dielectric 53 having a high dielectric constant, such as strontium titanate ($SrTiO_3$), barium titanate ($BaTiO_3$) or the like, and a thickness of, for example, 1 micrometer is then formed on the pad 20*a* by sputtering. A thin film layer of copper 57 having a thickness of, for example, 20 micrometers is then formed on the layer of dielectric 53 to produce the thin film capacitor 51. Subsequently, by repeating the steps described above, an intermediate product 50*a'* which is similar to the intermediate product 50*a* illustrated in FIG. 15 and has the incorporated capacitor 51 can be obtained, which can also be further processed to produce the product multilayered substrate 50' illustrated in FIG. 17.

In the embodiments described above, the copper sheet 40 is used for the production of the multilayered substrate. This copper sheet 40 may be replaced with a metallic sheet made of aluminum or stainless steel, for example. When such a metallic sheet made of aluminum or stainless steel is used, a seed layer 42 may also be formed between the pads 20*a* for the mounting of a semiconductor element and the metallic sheet to improve adhesion therebetween.

If the pads 20*a* for the mounting of a semiconductor element is formed of copper, and the metallic sheet is formed of aluminum, the metallic sheet can be etched without etching the pads 20*a* of copper by selecting an appropriate etchant, making the seed layer 42 unnecessary.

Moreover, when handleability of a multilayered substrate must be further enhanced, a metallic frame member 17 having a required strength may additionally be provided at a peripheral region of a multilayered substrate 10, as illustrated in FIG. 1.

It should be understood that the invention is not limited to the embodiments described herein, and various changes or modifications may be applied to those embodiments without departing from the spirit and scope of the invention. By way of example, a combination of concave vias and columnar vias (solid vias) may be used in a multilayered substrate of the invention.

As described, according to the invention, a multilayered substrate can have a surface for the mounting of a semiconductor element, which is flat or substantially flat, to thereby securely connect electrode terminals of the semiconductor element with the pads of the multilayered substrate. Further, the invention can make unnecessary a core substrate which is essential for the production of a conventional multilayered substrate, and can provide a thinner multilayered substrate.

What is claimed is:

1. A method of producing a substrate of multilayered structure, the method comprising providing a seed layer on a metal sheet, the seed layer being made up of a metal which is substantially not etched by an etchant subsequently used to remove the metal sheet, or comprising a sublayer made up of a metal which is substantially not etched by an etchant subsequently used to remove the metal sheet; and successively forming a plurality of sets of an insulation layer and a wiring line layer, wherein the plurality of sets of the insulation layer are formed on the seed layer provided on a metal sheet, forming a multilayered structure having a plurality of sets of an insulation layer and a wiring line layer, and having one face for mounting a semiconductor element thereon and an other face on which external connection terminals are to be provided, the face for mounting a semiconductor element being provided with pads to be bonded to an electrode terminal of the semiconductor element, the other face being provided with pads to be bonded to an external connection terminal, the wiring line layers on both sides of an insulation layer being connected with each other by vias piercing the insulation layer, and the surfaces of the pads to be bonded to an electrode terminal of a semiconductor element being flat and in the same plane.

2. The method of claim 1, comprising:
a) forming the seed layer on the metal sheet;
b) forming pads to be bonded to an electrode terminal of a semiconductor element on the seed layer;
c) forming an insulation layer to cover the pads;
d) forming openings in the insulation layer to expose the surface of the pad at the bottom of the opening;
e) forming a wiring pattern on the insulation layer while forming a via in the opening to connect the wiring pattern to the pad;
f) repeating the formation of an insulation layer, the formation of openings therein, and the formation of a wiring pattern and vias, which connect wiring patterns on both sides of an insulation layer with each other, to provide a given number of sets of insulation and wiring layers;
g) removing the metal sheet by etching; and
h) removing said seed layer.

3. The method of claim 1, comprising:
a) forming the seed layer on the metal sheet;
b) forming an insulation layer on the seed layer;
c) forming openings in the insulation layer to expose the surface of the sheet layer at the bottom of the opening;
d) forming a pad to be bonded to an electrode terminal of a semiconductor element, in the opening, the pad being made up of a layer of metal or two more layers of metals;

e) forming a wiring pattern on the insulation layer while forming a via in the opening to connect the wiring pattern to the pad;
f) repeating the formation of an insulation layer, the formation of openings therein, and the formation of a wiring pattern and vias, which connect wiring patterns on both sides of an insulation layer with each other, to provide a given number of sets of insulation and wiring layers;
g) removing the metal sheet by etching; and
h) removing the seed layer.

4. A method of producing a substrate of multilayered structure having a plurality of sets of an insulation layer and a wiring line layer, and having one face for mounting a semiconductor element thereon and an other face on which external connection terminals are to be provided, the face for mounting a semiconductor element being provided with pads to be bonded to an electrode terminal of the semiconductor element, the other face being provided with pads to be bonded to an external connection terminal, the wiring line layers on both sides of an insulation layer being connected with each other by vias piercing the insulation layer, and the surfaces of the pads to be bonded to an electrode terminal of a semiconductor element are flat and are in the same plane, the method comprising successively forming a plurality of sets of an insulation layer and a wiring line layer, wherein the plurality of sets of an insulation layer and a wiring line layer are formed on a metal sheet, and a metal, which is substantially not etched by an etchant subsequently used to remove the metal sheet, is used for the formation of the pads to be bonded to an electrode terminal of a semiconductor element.

5. The method of claim 4, comprising:
a) forming, on the metal sheet, pads made up of a metal which is substantially not etched by an etchant subsequently used to remove the metal sheet, or comprising a sublayer made up of a metal which is substantially not etched by an etchant subsequently used to remove the metal sheet, the pad to be bonded to an electrode terminal of a semiconductor element;
b) forming an insulation layer to cover the pads;
c) forming openings in the insulation layer to expose the surface of the pad at the bottom of the opening;
d) forming a wiring pattern on the insulation layer while forming a via in the opening to connect the wiring pattern to the pad, by use of a metal which is different from the material of the pad;
e) repeating the formation of an insulation layer, the formation of a wiring pattern and vias, which connect wiring patterns on both sides of an insulation layer with each other, to provide a given number of sets of insulation and wiring layers; and
f) removing the metal sheet by etching.

6. The method of claim 4, comprising:
a) forming an insulation layer on the metal sheet;
b) forming openings in the insulation layer to expose the surface of the metal sheet at the bottom of the opening;
c) forming, on the exposed surfaces of the metal sheet, pads made up of a metal which is substantially not etched by an etchant subsequently used to remove the metal sheet, or comprising a sublayer made up of a metal which is substantially not etched by an etchant subsequently used to remove the metal sheet, the pad to be bonded to an electrode terminal of a semiconductor element;

d) forming a wiring pattern on the insulation layer while forming a via in the opening to connect the wiring pattern to the pad, by use of a metal which is different from the material of the pad;

e) repeating the formation of an insulation layer, the formation of openings therein, and the formation of a wiring pattern and vias, which connect wiring patterns on both sides of an insulation layer with each other, to provide a given number of sets of insulation and wiring layers; and f) removing the metal sheet by etching.

7. The method of claims 2, 3, 5 or 6 which further comprises, subsequent to the formation of the pads to be bonded to an electrode terminal of a semiconductor element, forming a layer of dielectric and a layer of metal successively on part of the pads.

8. The method of claims 2, 3, 5 or 6 which comprises the following steps:

(a) providing a metal sheet, (b) forming, on the metal sheet, the pads to be bonded to an electrode terminal of the semiconductor element, (c) forming a layer of insulating material on the metal sheet so as to cover the pads formed thereon, (d) piercing the layer of insulating material to form holes which expose the end face of the pad, (e) forming a patterned metal layer to provide a layer of wiring lines which includes wiring lines formed on the layer of insulating material and vias, the via connecting the pad in the hole with the wiring line on the layer of insulation material, (f) forming a layer of insulation material to cover the layer of wiring line, (g) piercing the layer of insulating material formed in step (f) to form holes which expose part of the underlying wiring line, (h) forming a patterned metal layer to provide a layer of wiring lines which includes wiring lines formed on the layer of insulating material and vias, the via connecting the part of the wiring line exposed in step (g) with the wiring line on the layer of insulation material, (i) repeating steps (f) to (h) until the predetermined number of sets of an insulation layer and a wiring line layer is obtained, and (j) removing the metal sheet from the sets of an insulation layer and a wiring line layer formed thereon.

9. The method of claim 8, wherein the metal sheet is removed by etching.

10. The method of claim 8, wherein the metal sheet is made of copper, aluminum, or stainless steel.

11. The method of claim 9, wherein the metal sheet has a seed layer on a surface on which the sets of an insulation layer and a wiring line layer are to be formed, the seed layer being made up of two or more sublayers of different metal materials, and the sublayer in contact with the metal sheet being formed of a metal material which is not etched or is substantially not etched by an etchant for the metal sheet.

12. The method of claim 11, wherein the metal sheet is formed of copper, and the seed layer is made up of a sublayer, in contact with the metal sheet, of chromium or titanium, and another sublayer of copper.

13. The method of claim 8, wherein the metal sheet provided with a layer of insulating material on a surface is used, and the pads to be bonded to an electrode terminal of the semiconductor element is formed by piercing through the layer of insulating material to form holes exposing the surface of the metal sheet, and then electrolytically plating the exposed surface of the metal sheets to form a plated layer in the hole.

14. The method of claim 8, wherein the metal sheet is partially removed so as to leave a frame member on a peripheral region of the multilayered substrate.

15. The method of claim 8, wherein the formation of vias in steps (e) and/or (h) is carried out by forming a metal layer along the inside wall and bottom of the hole piercing through the insulation layer.

16. The method of claim 8, wherein the formation of vias in steps (e) and/or (h) is carried out by making a column of metal material filling the hole piercing through the insulation layer.

17. The method of claim 16, wherein the column is made by forming a layer of metal to cover the insulation film and fill the holes piercing through the insulation film, and then abrading the formed layer of metal to expose the insulation film and leave the metal filling the hole.

18. The method of claim 8, wherein the pad to be bonded to an electrode terminal of the semiconductor element is formed so as to have a surface layer of metallic material which is melted at a temperature used to bond the pad to the electrode terminal of the semiconductor element.

19. The method of claim 18, wherein the surface layer is formed of a solder material.

20. The method of claim 8, wherein the pad to be bonded to an electrode terminal of the semiconductor element is formed so as to have two or more layers of metals, the layer to be directly in contact with the electrode terminal of the semiconductor element based on a noble metal.

21. The method of claim 20, wherein the noble metal is gold.

* * * * *

UNITED STATES PATENT AND TRADEMARK OFFICE
CERTIFICATE OF CORRECTION

PATENT NO.    : 6,418,615 B1
DATED         : July 16, 2002
INVENTOR(S)   : Akio Rokugawa et al.

It is certified that error appears in the above-identified patent and that said Letters Patent is hereby corrected as shown below:

<u>Title page,</u>
Change Item [73], as follows:
-- [73]   Assignee:  Shinko Electric Industries Co., Ltd., Nagano (JP) --

Signed and Sealed this

Fourteenth Day of January, 2003

JAMES E. ROGAN
*Director of the United States Patent and Trademark Office*